US 8,217,659 B2

United States Patent
Li et al.

(10) Patent No.: US 8,217,659 B2
(45) Date of Patent: Jul. 10, 2012

(54) METHOD FOR ON-LINE MEASUREMENT OF BATTERY INTERNAL RESISTANCE, CURRENT OPERATIONAL MODULE, AND ON-LINE MEASUREMENT INSTRUMENT FOR BATTERY INTERNAL RESISTANCE

(76) Inventors: Qinglan Li, Zheng Zhou (CN); Xiangchen Xu, Milpitas, CA (US)

(*) Notice: Subject to any disclaimer, the term of this patent is extended or adjusted under 35 U.S.C. 154(b) by 1170 days.

(21) Appl. No.: 12/071,760

(22) Filed: Feb. 26, 2008

(65) Prior Publication Data
US 2008/0284444 A1 Nov. 20, 2008

(30) Foreign Application Priority Data
May 15, 2007 (CN) .......................... 2007 1 0054396

(51) Int. Cl.
*G01N 27/416* (2006.01)
*H02J 7/00* (2006.01)
(52) U.S. Cl. ...................... 324/430; 320/136
(58) Field of Classification Search .................. 324/430, 324/433; 320/132, 135, 136, 139
See application file for complete search history.

(56) References Cited

U.S. PATENT DOCUMENTS

| | | | |
|---|---|---|---|
| 4,361,809 A | 11/1982 | Bil et al. | |
| 5,773,978 A | 6/1998 | Becker | |
| 5,994,876 A * | 11/1999 | Canny et al. | 320/132 |
| 6,002,238 A * | 12/1999 | Champlin | 320/134 |
| 6,268,732 B1 * | 7/2001 | Jones et al. | 324/429 |
| 6,441,585 B1 * | 8/2002 | Bertness | 320/132 |
| 7,723,959 B2 * | 5/2010 | DePaula et al. | 320/132 |
| 7,759,901 B2 * | 7/2010 | Hirsch et al. | 320/129 |

FOREIGN PATENT DOCUMENTS

| | | |
|---|---|---|
| CN | 1325551 A | 12/2001 |
| CN | 200520100597.3 | 4/2006 |
| CN | 200520133538.6 | 11/2006 |
| CN | 201035127 Y | 3/2008 |
| CN | 201037863 Y | 3/2008 |
| CN | 201037864 Y | 3/2008 |
| JP | 2000-268885 A | 9/2000 |
| JP | 2003-264000 A | 9/2003 |
| JP | 2006-284537 A | 10/2006 |

OTHER PUBLICATIONS

Chen, China Academic Journal Electronic Publishing House, "Measurement Equipment for Battery Internal Resistance", 1994-2008, pp. 46-51.

* cited by examiner

*Primary Examiner* — Richard V Muralidar
(74) *Attorney, Agent, or Firm* — Birch, Stewart, Kolasch & Birch, LLP

(57) ABSTRACT

A method and a current operational module for on-line measurement of battery internal resistance and an on-line measurement instrument for battery internal resistance have high measurement accuracy and strong anti-interference ability. The on-line measurement instrument for battery internal resistance comprises a current work module, a voltage measurement module, an analog to digital conversion module, a signal generation module, a center processing module, an Input/Output module, and a power supply module used for on-line measurement of battery internal resistance.

12 Claims, 12 Drawing Sheets

METHOD FOR ON-LINE MEASUREMENT OF BATTERY INTERNAL RESISTANCE, CURRENT OPERATIONAL MODULE, AND ON-LINE MEASUREMENT INSTRUMENT FOR BATTERY INTERNAL RESISTANCE

FIELD OF THE INVENTION

The present invention relates to a method and an instrument for measuring battery, especially to a method and a current operational module for on-line measurement of battery internal resistance and an on-line measurement instrument for battery internal resistance with high measurement accuracy and high anti-interference ability.

BACKGROUND

Series-connected Valve Regulated Lead Acid Batteries (VRLA) are adopted as batteries of standby power supply in the fields such as power generation, power supply and communication. When Alternating Current (AC) power supply has a failure, the standby power supply must supply uninterrupted power at once to guarantee the normal operation of the whole system. Therefore, it is very important about how to judge that whether battery has good power supply ability or not for reliability and security of the above mentioned fields. Since VRLA battery is hermetically sealed, the internal material can not be detected with a visual method. However, the power supply ability of battery can be estimated well through detecting battery internal resistance. Generally, if battery internal resistance is 25% more than the average value of internal resistance of the storage battery, power supply ability of the battery is already decreased, it should be mainly monitored; if battery internal resistance is 50% more than the average value of internal resistance of the storage battery, power supply ability of the battery is not reliable, it should be replaced. Since the value of battery internal resistance is extremely little, for example, the internal resistance range of widely used 100-4000A VRLA battery is about 1.5-0.06 mΩ, and the battery of standby battery is commonly on a floating charge state, charge current provided by a rectifying circuit in a battery charger imposes large interference signals on two ends of the battery, and to guarantee the reliability of the standby power supply, the cable connecting to the battery can absolutely not be cut off to measure resistance, on-line resistant measurement can only process in a strong interference environment of battery floating charge, this causes a big problem for detection of battery power supply ability.

CN patent application No. 200520100597.3 discloses a battery on-line monitoring system. This system includes a monitoring computer which is used to connect sectional tap of storage battery to an internal resistance load module and a battery voltage detection module used to alternative discharge, the computer connects sectional tap of storage battery through the internal resistance load module, each sectional storage battery following the tap is alternatively discharged, the battery voltage detection module is used to collect discharge and recovery voltage curves of each battery, and thereby the internal resistance of each battery is calculated. However, this disclosed system only simply introduces the connection relationship among each part, the principle and concrete steps are not sufficiently disclosed, it can not understand and evaluate the system. CN patent application No. 200520133538.6 discloses an on-line monitoring system for battery internal resistance and deterioration state, the invention mainly sets sectional points in storage battery, and there is no specific description for the concrete measurement circuits for each battery, it can not understand and evaluate the system as well.

SUMMARY OF THE INVENTION

An object of the present invention is: conquering current technique defects, providing a method and a current operational module for on-line measurement of battery internal resistance and an on-line measurement instrument for battery internal resistance with high measurement accuracy and strong anti-interference ability.

The present invention provides an on-line measurement method for battery internal resistance including: two operational modules paralleled-connected with the positive end and the negative end of the battery to be measured. One module is a current operational module which is used to generate an excitation signal and measure the excitation current passing through the battery under measurement, the other module is a voltage measurement module which is used to measure excitation voltage on two ends of the battery under measurement; the current operational module adopts a load circuit discharged with pulse Direct Current (DC) to generate an excitation signal, the pulse direct current has a DC component and a sine AC component, the work power of the load circuit is supplied by an auxiliary power supply connection in series with the load circuit, the discharge process of the load circuit is controlled by a signal generation module; the voltage measurement module firstly adopts a stopping capacitor to get rid of DC component in the voltage signal, and adopts an operational amplifier to amplify the voltage signal, then a high efficient digital filter is used for filtering; the output current signal from the current operational module and the output voltage signal from the voltage measurement module are converted to digital signals after analog to digital converting, then the digital signal is sent to a center processing module, according to the measured value of the current signal and the voltage signal, the central processing module calculates the internal resistance of the battery under measurement with Ohm's law.

The current operational module adopts a precise current detection amplifier to process current detection, the load circuit, the precise current detection amplifier, and the auxiliary power supply are connected in series, and the work power of the load circuit and the precise current detection amplifier are supplied by the auxiliary power supply.

The signal generation module generates a pulse DC voltage signal to control the load circuit discharge with a pulse DC, the frequency of the sine AC component of the pulse DC voltage signal is 10 Hz-25 Hz.

The output signal of the high efficient digital filter is output to the following circuits after passing through a resistance-capacitance coupled circuit; the output signal of the load circuit or the precise current detection amplifier is output to the following circuits after passing through a stopping circuit.

The measurement method can also be used to measure resistance of a mental stick or a mental bar; the auxiliary power supply is batteries or a DC voltage-stabilized supply.

A current operational module for on-line measurement of battery internal resistance, comprises a load circuit discharge with a pulse DC, an auxiliary power supply and a stopping circuit, the pulse DC has a DC component and a sine AC component, the load circuit and the auxiliary power supply are connected in series, the output of the load circuit is connected with the input of the stopping circuit.

The current operational module for on-line measurement of battery internal resistance still comprises a precise current detection amplifier, the precise current detection amplifier, the load circuit and the auxiliary power supply are connected in series, the output of the precise current detection amplifier is connect with the input of the stopping circuit.

The load circuit comprises a triode T1 and a triode T2, the input of the load circuit is connected with the base of the triode T1 through resistor R4, the emitter of the triode T1 is connected with the base of the triode T2, the collector of the triode T1 and the collector of the triode T2 are connected together and connected with the negative end of the internal detection resistance of the precise current detection amplifier or connected with the positive end of the auxiliary power supply, the emitter of the triode T1 and the emitter of the triode T2 are connected with the negative end of the battery under measurement through resistor R5 and resistor R6 respectively; the stopping circuit comprises capacitor C0, resistor R0 and resistor R1, two ends of capacitor C0 are respectively used as the input and the output of the stopping circuit, and two ends of capacitor C0 are connected to ground through resistor R0 and resistor R1 respectively; the input of the stopping circuit is connected with the emitter of the triode T2, or connected with the output of the precise current detection amplifier; the negative end of the auxiliary power supply is connected with the positive end of the battery under measurement.

The current operational module for on-line measurement of battery internal resistance still comprises an operational amplifier IC2, the input of the operational amplifier IC2 is connected with the output of the stopping circuit.

The triode T1 is a low power triode; the triode T2 is a high power triode; the model of the precise current detection amplifier is MAX471, or MAX472, or MAX4069, or MAX4070, or MAX4071, or MAX4072; the model of the operational amplifier IC2 is TLC2272, or TLC2274, or AD822, or AD824, or OP200, or AD708, or TLC2264, or TLC2262, or TL062, or TL064, or TL084; the capacitance of capacitor C0 is 5 µF-10 µF; the resistance of resistor R1 is 50 KΩ-100 KΩ; the resistance of resistor R0 is 2 KΩ±5%; the auxiliary power supply is batteries or a DC voltage-stabilized supply.

An on-line measurement instrument for battery internal resistance, comprises a current operational module, a voltage measurement module, a analog to digital conversion module, a signal generation module, a central processing module, a Input/Output module, and a power supply module used for on-line measurement of battery internal resistance, wherein, the current operational module and the voltage measurement module used for on-line measurement of battery internal resistance are parallel connected to the positive end and the negative end of the battery under measurement, the output of the current operational module and the output of the voltage measurement module are connected with analog to digital conversion input of the analog to digital conversion module, the Input/Output of the central processing module are connected with the analog to digital conversion module, the signal generation module and the Input/Output Module, the output of the signal generation module is connected with the input of the load circuit of the current operational module used for on-line measurement of battery internal resistance, the output of the power supply module is connected with the power supply end of the current operational module, the voltage measurement module, the analog to digital conversion module, the signal generation module, the central processing module and the Input/Output module used for on-line measurement of battery internal resistance.

The voltage measurement module comprises a stopping capacitor, a operational amplifier, a high efficient digital filter, a microprocessor IC13 used to generate a precise clock signal and a resistance-capacitance coupled circuit; the stopping capacitor comprises capacitor C10 and capacitor C11, one end of capacitor C11 is connected with the negative end of the battery under measurement, the other end of capacitor C11 is connected with the positive input of the operational amplifier IC10, one end of capacitor C10 is connected with the positive end of the battery under measurement, the other end of capacitor C10 is connected with the negative input of the operational amplifier IC10, the output of operational amplifier IC10 is connected with the input of the high efficient digital filter through the operational amplifier IC11, one output of the microprocessor IC13 is connected with the clock input of the high efficient digital filter, the output of the high efficient digital filter is connected with the input of the resistance-capacitance coupled circuit, the output of the resistance-capacitance coupled circuit is connected with the input of the operational amplifier IC14.

Resistor R10 and resistor R11 are connected in series and then are parallel connected between the positive input and the negative input of the operational amplifier IC10, the connection point of resistor R10 and resistor R11 is either connected with ground or not connected with ground; the resistance-capacitance coupled circuit comprises capacitor C14 and resistor R16, one end of capacitor C14 is regarded as the input of the resistance-capacitance coupled circuit, the other end is regard as the output of the resistance-capacitance coupled circuit and connected with one end of resistor R16, the other end of resistor R16 is connected with ground.

The analog to digital conversion module comprises an analog to digital converter and a precise voltage reference source, the output of the precise voltage reference source is connected with the voltage reference input of the analog to digital converter, the positive end of the battery under measurement is connected with the analog to digital conversion input of the analog to digital conversion module; the signal generation module comprises a microprocessor IC30, a digital to analog converter, and an operational amplifier IC32, the data output of the microprocessor IC30 is connected with the data input of the digital to analog converter, the output of the digital to analog converter is connected with the input of the operational amplifier IC32, the output of the operational amplifier IC32 is connected with the input of the load circuit; the central processing module comprises a microprocessor IC51, a temperature detector, a calendar clock generator, and a data memory, the Input/Output of the microprocessor IC51 are connected with the Input/Output of the temperature detector, the calendar clock generator, and the data memory, the interrupt input of the microprocessor IC51 is connected with the output of the microprocessor IC30; the Input/Output module comprises a serial port conversion module, a display, a keyboard and a printer; the power supply module comprises a regulator.

The model of the high efficient digital filter is MAX291, or MAX292, or MAX295, or MAX296, or MAX293, or MAX294, or MAX297, or MAX280; the model of the operational amplifiers IC10 is AD620, or AD622, or AD625; the model of the operational amplifiers IC11, IC14 and IC32 is TLC2272, or TLC2274, or AD822, or AD824, or OP200, or AD708, or TLC2264, or TLC2262 or TL062, or TL064, or TL084; the model of the microprocessor IC51 is PIC16C74; the model of the microprocessor IC30 is PIC16C54; the model of the microprocessor IC13 is PIC12C508; the module of the analog to digital converter is TLC2543, or AD7888, or AD5320, or AD7871 or TLC2558; the model of the precise reference voltage source is MC1403, or AD580, or LM113; the model of the digital to analog converter is DAC0832, or AD7524, or AD7533, or AD558, or TLC5620, or TLC5617; the model of the calendar clock generator is 12C887; the model of the temperature detector is 18B20; the model of the data memory is 24C64; the serial port conversion module is an RS-232 serial port conversion module; the display is an LED display; the capacitance of capacitor C14 is 1-10 μF; the resistance of resistor R16 is 20 KΩ-200 KΩ.

The beneficial effects of the present invention:

The on-line measurement method for battery internal resistance according to the present invention adopts a pulse DC discharge circuit to discharge the battery under measurement, so that the advantages of "DC discharge method" and "AC method" are synthesized, and the problems of zero float for "DC discharge method" and easy to have interference for "AC method" can be avoided, so that the present method has a relative high measurement accuracy.

The current operational module for on-line measurement of battery internal resistance adopts an auxiliary power supply to supply work voltage to the precise current detection amplifier and the load circuit, and the excitation current signal passing through the battery is not affected, the difficulty of supplying power to the measurement circuits when adopting a pulse DC signal as the excitation signal is conquered.

The voltage measurement module according to the present invention adopts "MAX291" type high efficient digital filter, the strong attenuation characteristic thereof to the signal with a frequency higher than the frequency of the signal under measurement is fully utilized, the efficient measurement signal is separated from a strong interference background signal, and a resistance-capacitance coupled circuit is adopted meanwhile, the effect of the output offset voltage of "MAX291" type high efficient digital filter to the voltage measurement signal is efficiently eliminated, meanwhile the neutral point voltage of the voltage measurement signal is kept in the ground level, the measurement accuracy is obviously improved.

The on-line measurement method for battery internal resistance according to the present invention adopts a frequency from 10 Hz to 25 Hz as the frequency of sine AC component signal in the pulse DC signal, the interface from a rectifying circuit in a battery charger is avoided, and the measurement reliability is improved.

The on-line measurement instrument for battery internal resistance according to the present invention adopts digital circuits controlled by a microprocessor to generate a simulated pulse DC signal, high control accuracy and accurate measurement can be achieved, the measurement accuracy for battery internal resistance can reach 0.01 mΩ.

The on-line measurement instrument for battery internal resistance according to the present invention can not only used to measure battery internal resistance, but also used to measure resistance of a mental stick or a mental bar, it can be widely used.

Each functional module in the on-line measurement instrument for battery internal resistance according to the present invention all adopts measurement chip with high accuracy and high reliability; therefore, it has a strong anti-interference ability and can accurately measure battery internal resistance during floating charge.

The on-line measurement instrument for battery internal resistance according to the present invention can calculate and process measured data, then the data are sent to a display and a printer for output, the instrument can also communicate with a computer, and record environment temperature and time at the same time, therefore, it has high intelligence and is easy to use.

DETAILED DESCRIPTION OF THE INVENTION

Embodiment 1

Figure 1:
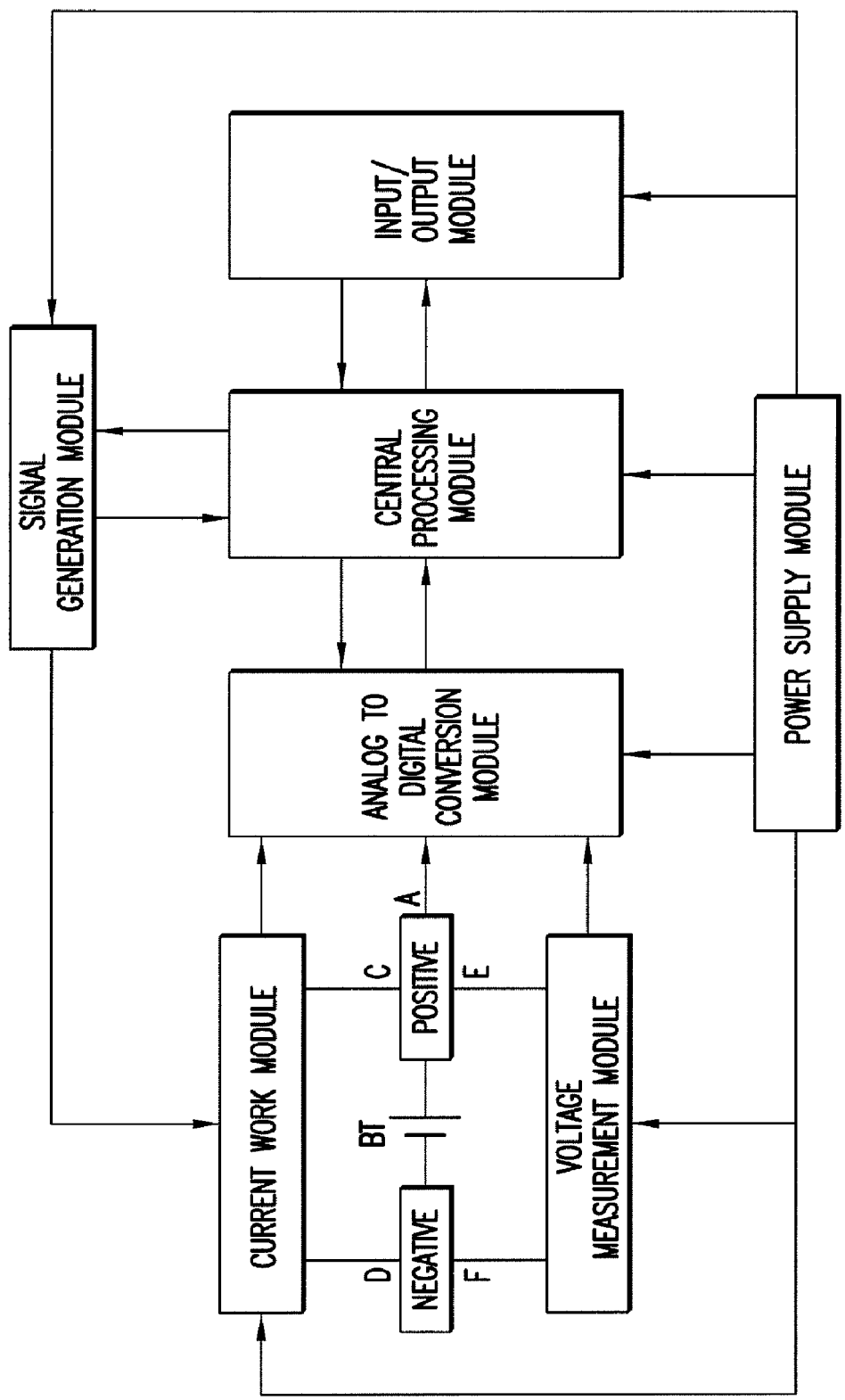
FIG. 1 is a diagram showing the working principle of an on-line measurement instrument for battery internal resistance.
Figure 2:
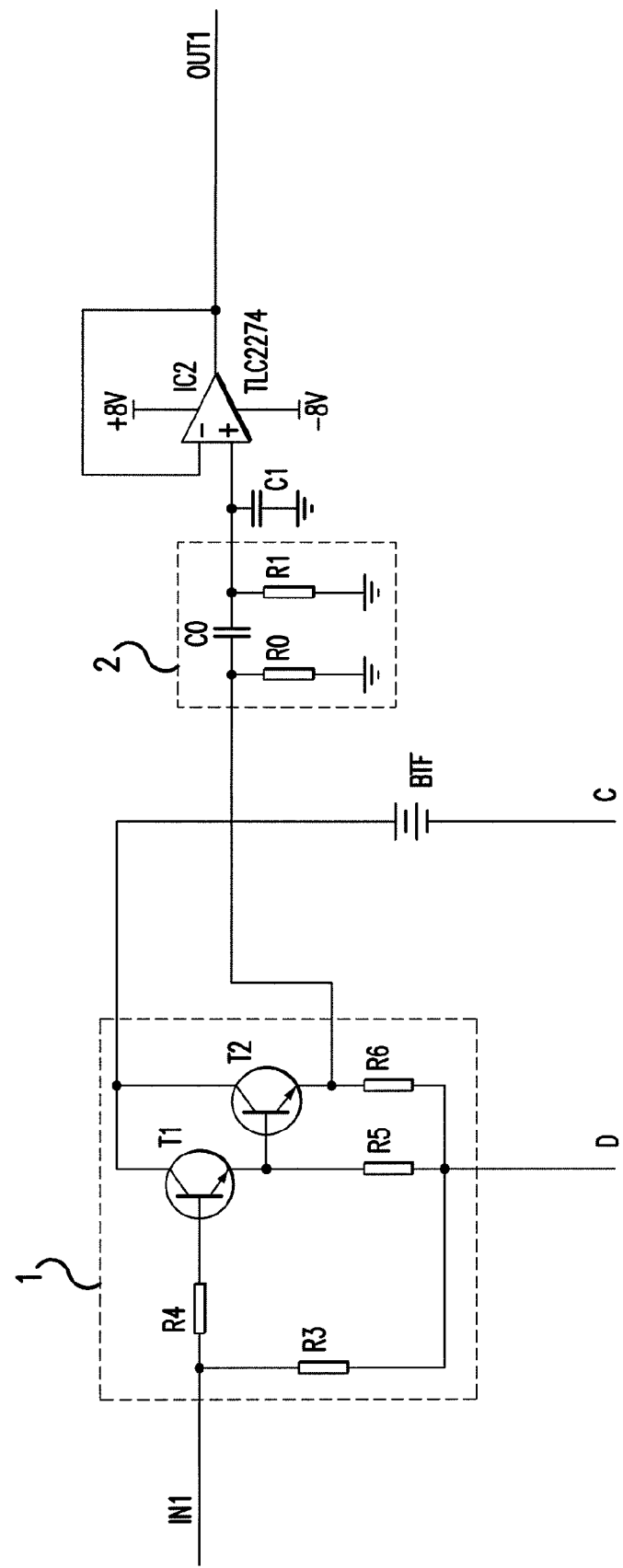
FIG. 2 is a schematic diagram showing the working principle of a current operational module for on-line measurement of battery internal resistance.
Figure 6:
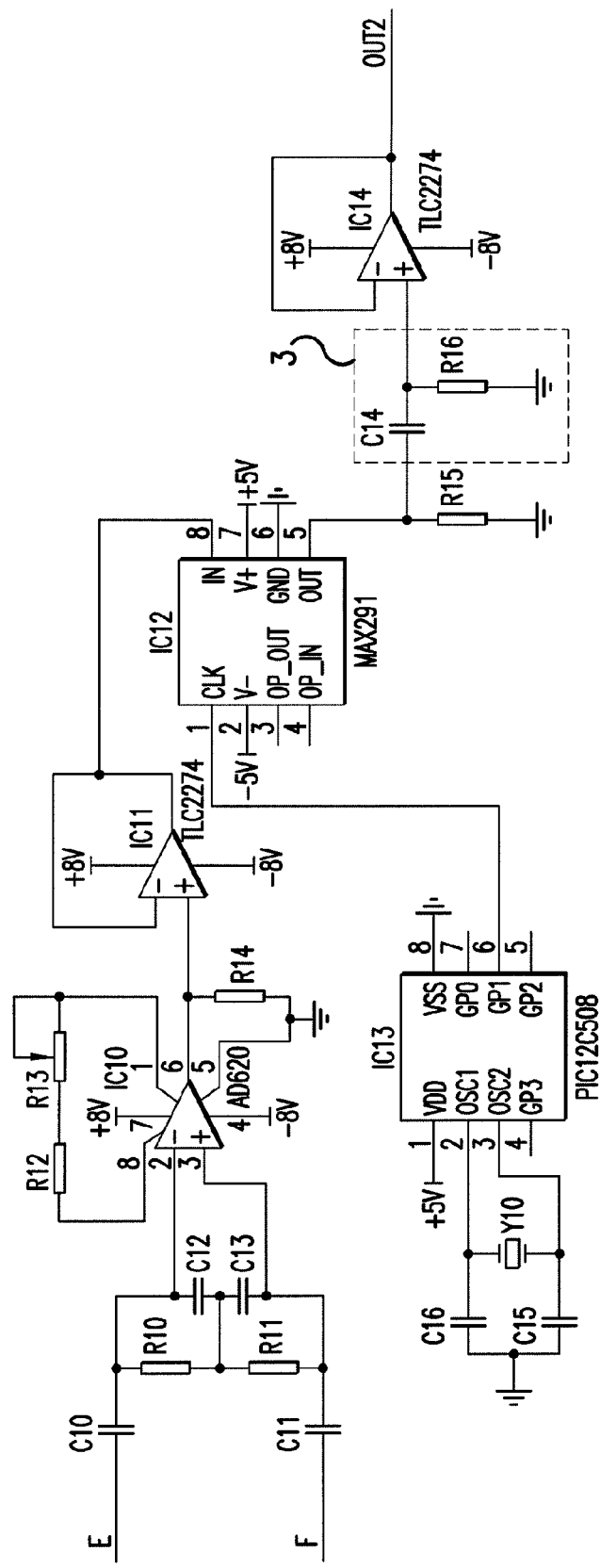
FIG. 6 is a schematic diagram showing a voltage measurement module.
Figure 7:
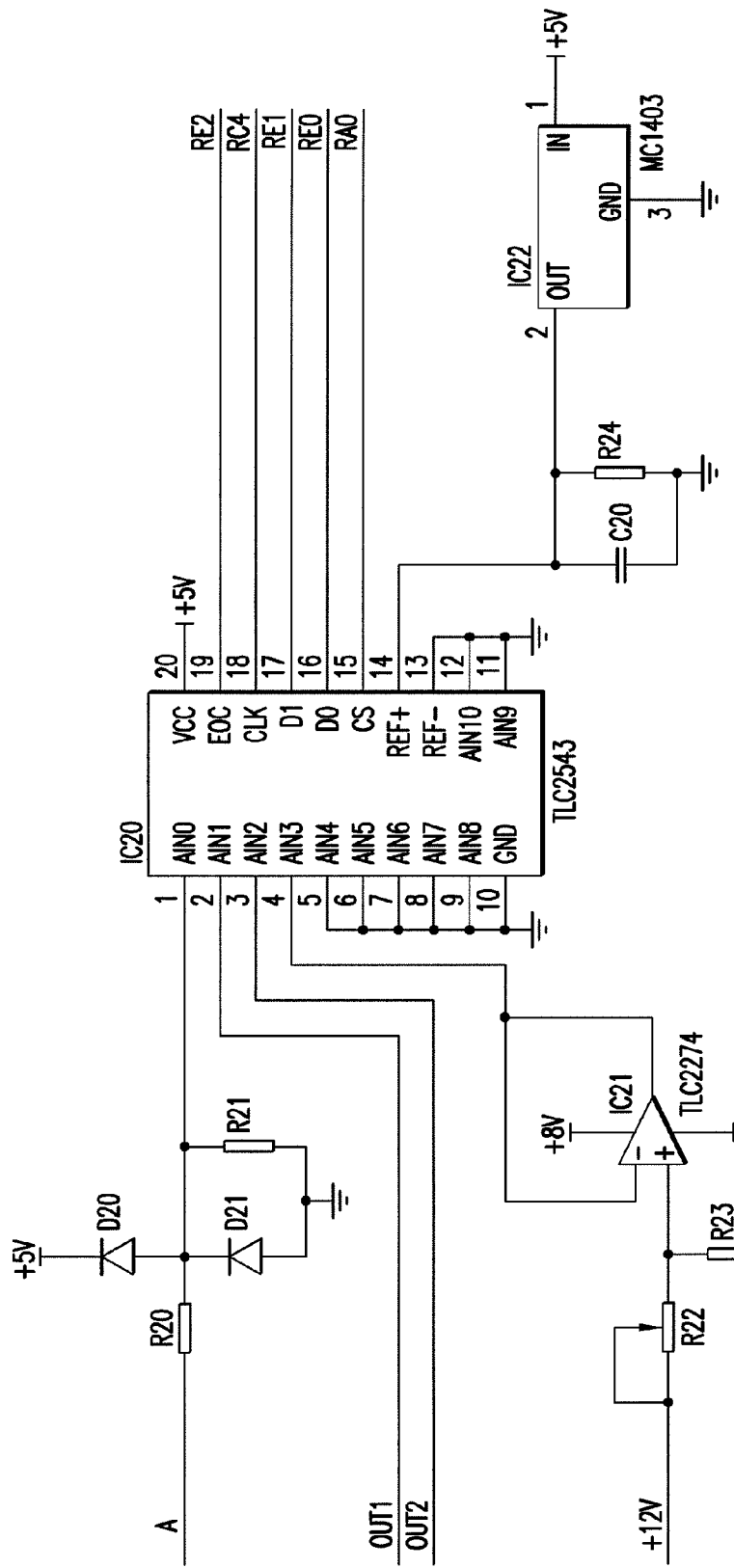
FIG. 7 is a schematic diagram showing an analog to digital conversion module.
Figure 8:
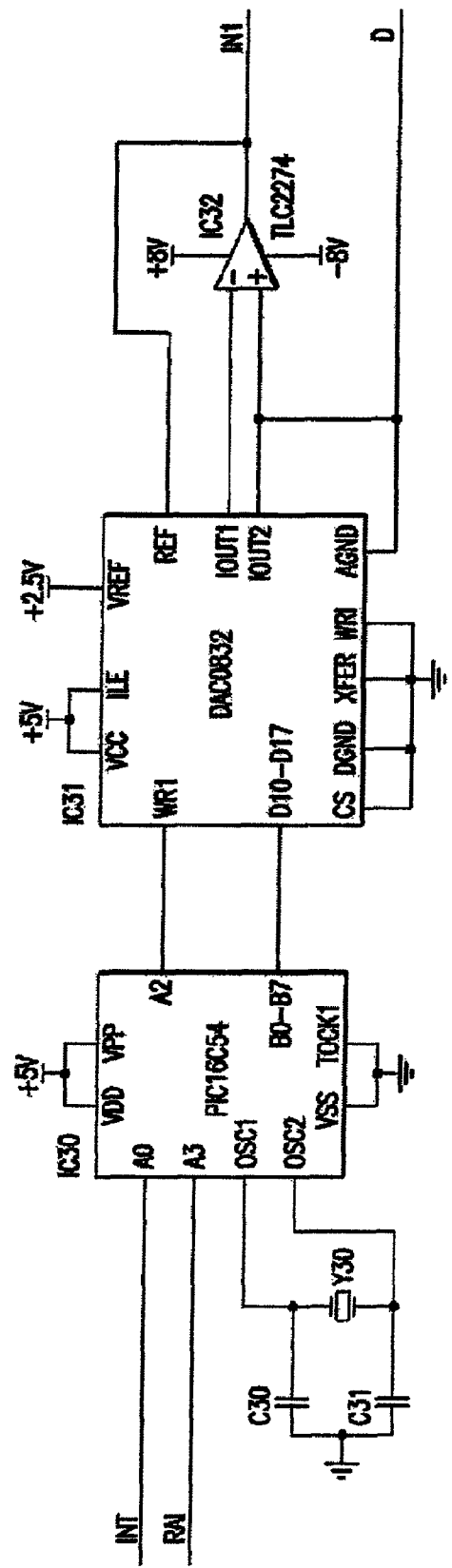
FIG. 8 is a schematic diagram showing a signal generation module.
Figure 9:
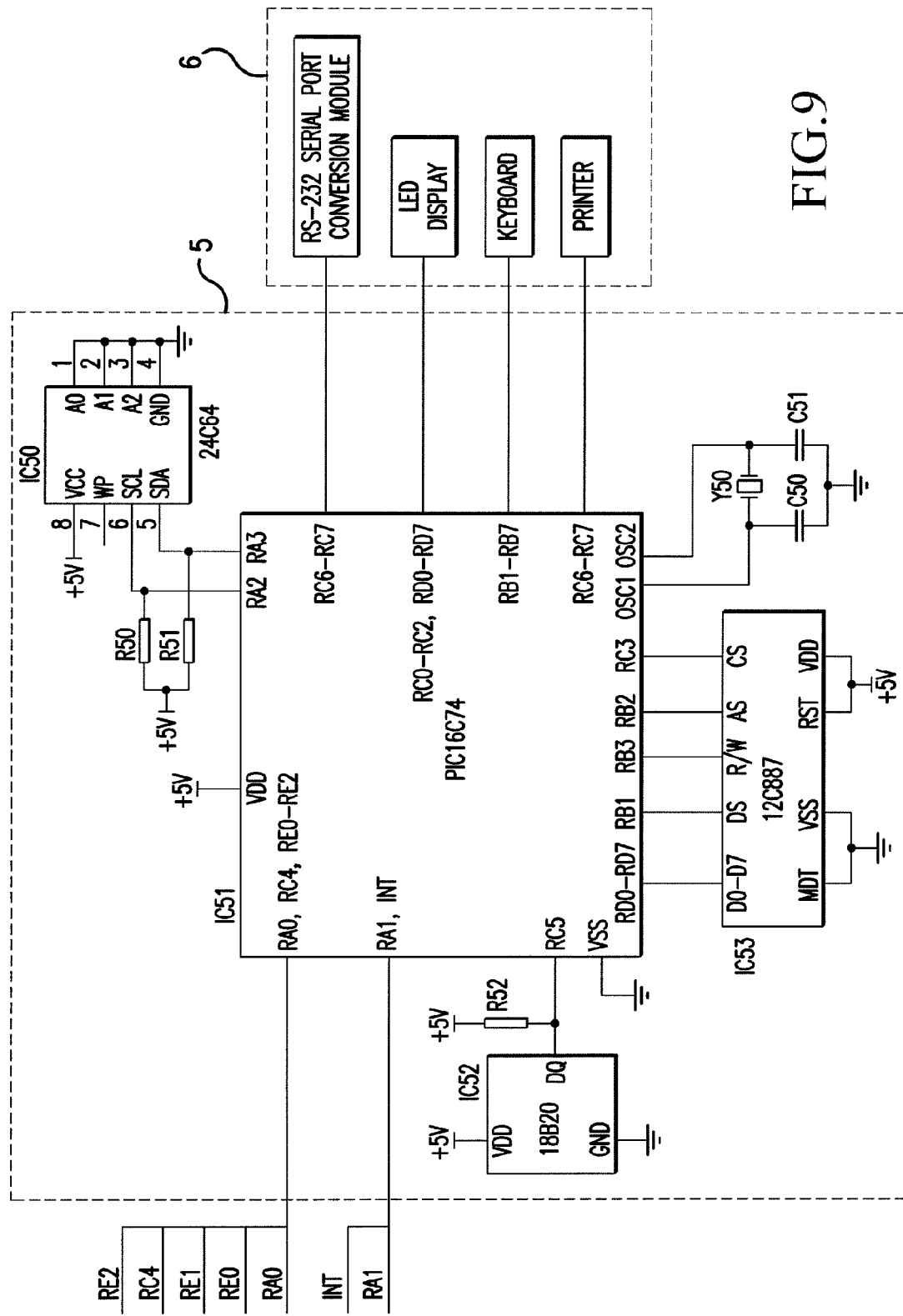
FIG. 9 is a schematic diagram showing a central processing module and an Input/Output module.
Figure 10:
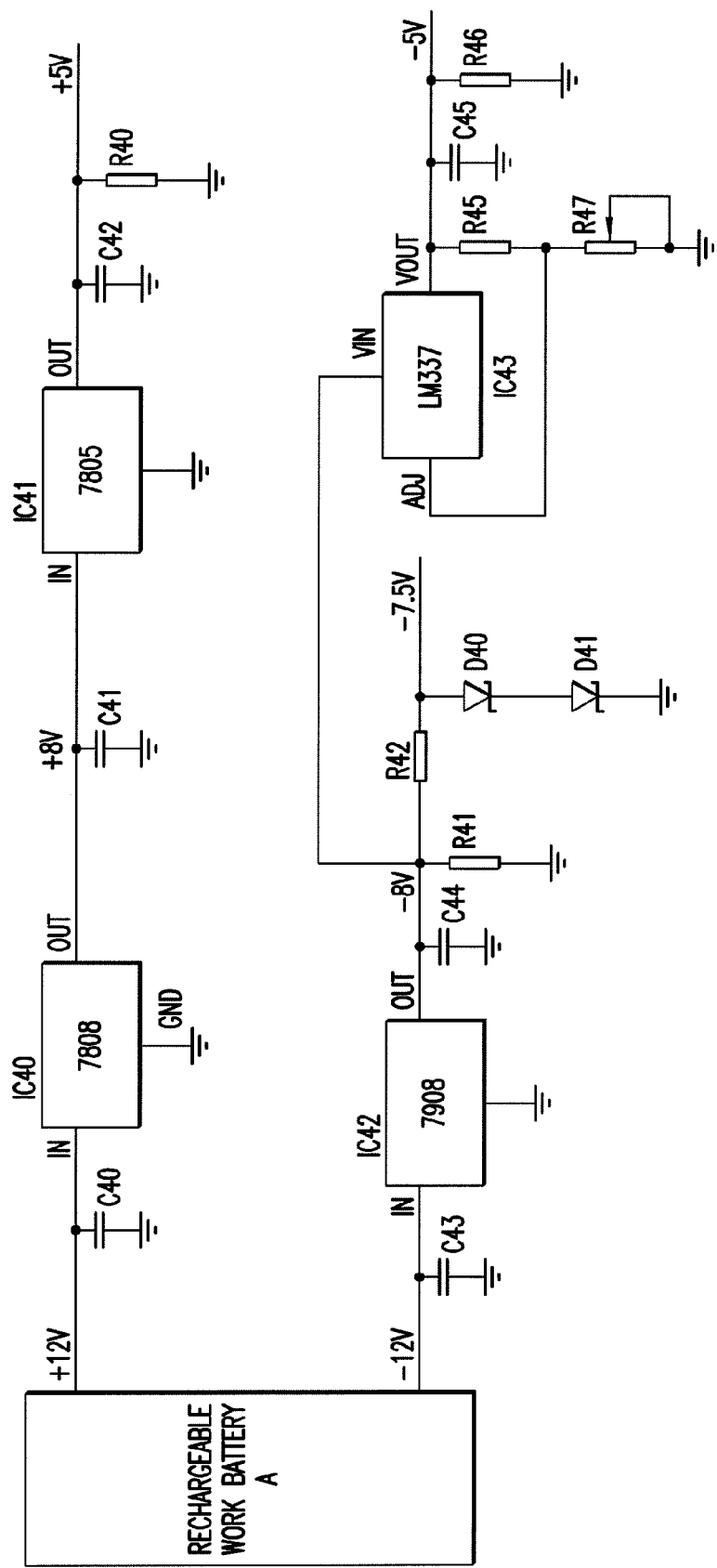
FIG. 10 is a schematic diagram showing a power supply module.
Figure 12:
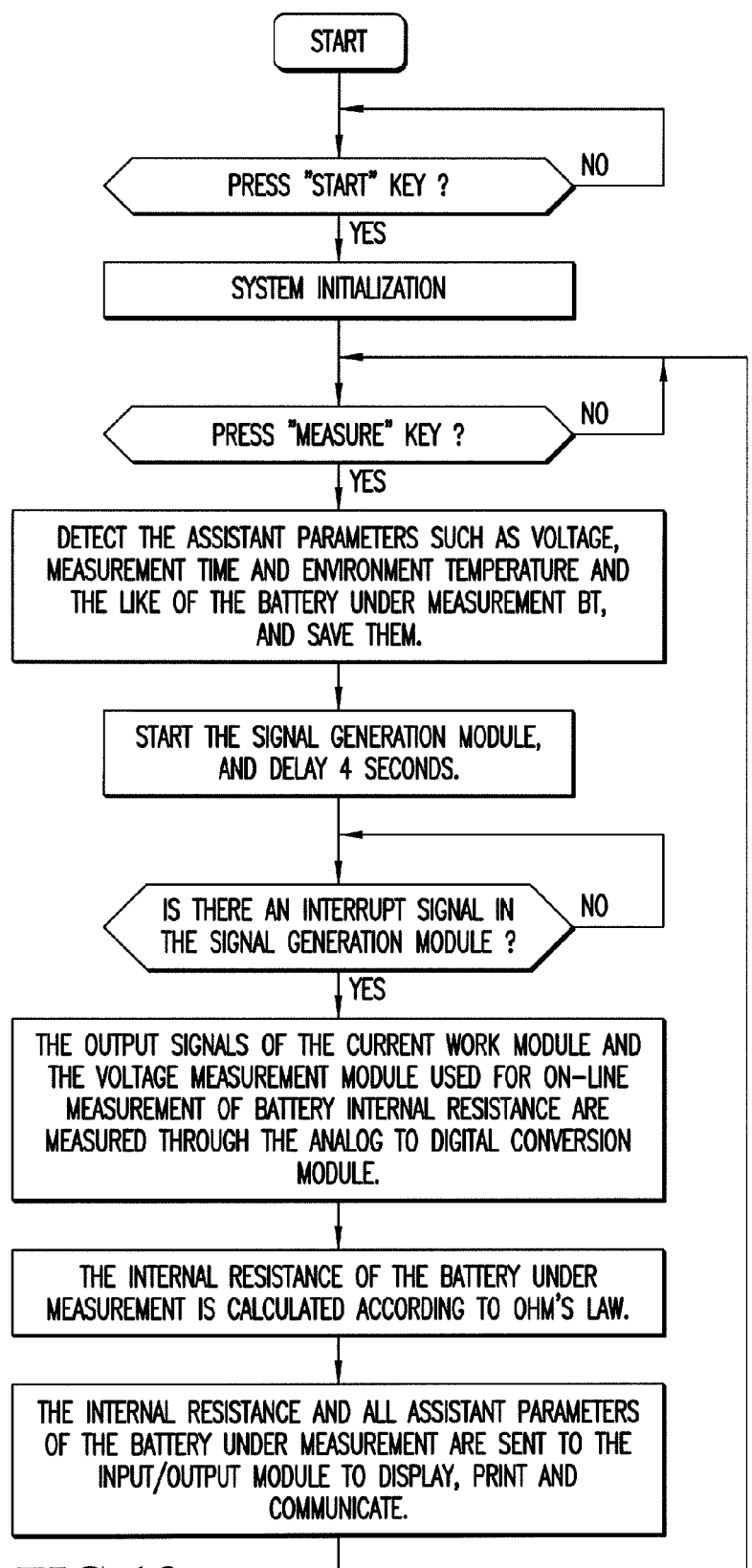
FIG. 12 is a diagram showing the working flow of an on-line measurement instrument for battery internal resistance.

With Reference to FIG. 1, FIG. 2, FIG. 6-10, FIG. 12, a current operational module for on-line measurement of battery internal resistance, comprises a load circuit 1 discharging with a pulse DC, an auxiliary power supply BTF and a stopping circuit 2, the pulse DC has a DC component and a sine AC component, the load circuit 1 and the auxiliary power supply BTF are connected in series, the output of the load circuit 1 is connect with the input of the stopping circuit 2.

The load circuit 1 comprises a triode T1 and a triode T2, the input of the load circuit 1 is connected with the base of the triode T1 through resistor R4, the emitter of the triode T1 is connected with the base of the triode T2, the collector of the triode T1 and the collector of the triode T2 are connected together and connected with the positive end of the auxiliary power supply BTF, the emitter of the triode T1 and the emitter of the triode T2 are connected with the negative end of the battery BT under measurement through resistor R5 and resistor R6 respectively; the stopping circuit 2 comprises capacitor C0, resistor R0 and resistor R1, two ends of capacitor C0 are used as the input and output of the stopping circuit 2, and two ends of capacitor C0 are connected to ground through resistor R0 and resistor R1 respectively; the input of the stopping circuit 2 is connected with the emitter of the triode T2; the negative end of the auxiliary power supply BTF is connected with the positive end of the battery BT under measurement.

The current operational module for on-line measurement of battery internal resistance further comprises an operational amplifier IC2, the input of the operational amplifier IC2 is connected with the output of the stopping circuit 2.

The triode T1 is a low power triode; the triode T2 is a high power triode; the model of the operational amplifier IC2 is TLC2272; the capacitance of capacitor C0 is 5 µF; the resistance of resistor R1 is 100 KΩ; the resistance of resistor R0 is 2 KΩ; the auxiliary power supply BTF is batteries.

The on-line measurement instrument for battery internal resistance, comprises a current operational module, a voltage measurement module, an analog to digital conversion module, a signal generation module, a central processing module 5, a Input/Output module 6, and a power supply module used for on-line measurement of battery internal resistance, the current operational module and the voltage measurement module used for on-line measurement of battery internal resistance are paralleled connected to the positive end and the negative end of the battery under measurement, the outputs of the current operational module and the voltage measurement module are connected with analog to digital conversion input of the analog to digital conversion module, the Input/Output of the central processing module 5 are connected with the analog to digital conversion module, the signal generation module and the Input/Output Module 6, the output of the signal generation module is connected with the input of the load circuit 1 of the current operational module used for on-line measurement of battery internal resistance, the output of the power supply module is connected with the power supply end of the current operational module, the voltage measurement module, the analog to digital conversion module, the signal generation module, the central processing module 5 and the Input/Output module 6 used for on-line measurement of battery internal resistance.

The voltage measurement module comprises a stopping capacitor, a operational amplifier, a high efficient digital filter, a microprocessor IC13 used to generate a precise clock signal and a resistance-capacitance coupled circuit 3; the stopping capacitor comprises capacitor C10 and capacitor C11, one end of capacitor C11 is connected with the negative end of the battery under measurement BT, the other end of capacitor C11 is connected with the positive input of the operational amplifier IC10, one end of capacitor C10 is connected with the positive end of the battery under measurement BT, the other end of capacitor C10 is connected with the negative input of operational amplifier IC10, the output of operational amplifier IC10 is connected with the input of the high efficient digital filter through the operational amplifier IC11, one output of the microprocessor IC13 is connected with the clock input of the high efficient digital filter, the output of the high efficient digital filter is connected with the input of the resistance-capacitance coupled circuit 3, the output of the resistance-capacitance coupled circuit 3 is connected with the input of the operational amplifier IC14.

Resistor R10 and resistor R11 are connected in series and then paralleled connected between the positive input and the negative input of the operational amplifier IC10, the resistance-capacitance coupled circuit 3 comprises capacitor C14 and resistor R16, one end of capacitor C14 is regarded as the input of the resistance-capacitance coupled circuit 3, the other end is regard as the output of the resistance-capacitance coupled circuit 3 and connected with one end of resistor R16, the other end of resistor R16 is connected with ground.

The analog to digital conversion module comprises an analog to digital converter IC20 and a precise voltage reference source IC22, the output of the precise voltage reference source IC22 is connected with the voltage reference input of the analog to digital converter IC20, the positive end of the battery under measurement BT is connected with the analog to digital conversion input of the analog to digital conversion module; the signal generation module comprises a microprocessor IC30, a digital to analog converter IC31, and an operational amplifier IC32, the data output of the microprocessor IC30 is connected with the data input of the digital to analog converter IC31, the output of the digital to analog converter IC31 is connected with the input of the operational amplifier IC32, the output of the operational amplifier IC32 is connected with the input of the load circuit 1; the central processing module 5 comprises a microprocessor IC51, a temperature detector IC52, a calendar clock generator IC53, and a data memory IC50, the Input/Output of the microprocessor IC51 are connected with the Input/Output of the temperature detector IC52, the calendar clock generator IC53, and the data memory IC50, the interrupt input of the microprocessor IC51 is connected with the output of the microprocessor IC30; the Input/Output module 6 comprises an RS-232 serial port conversion module, an LED display, a keyboard and a printer; the power supply module comprises a regulator.

The signal generation module adopts the microprocessor IC30 to control the digital to analog converter IC31 to generate a pulse DC voltage signal; the signal controls the load circuit 1 discharge with pulse DC, the frequency of the sine AC component of the pulse DC voltage signal is 18.5 Hz.

The analog to digital conversation module also comprises an operational amplifier IC21, the input of the operational amplifier IC21 is connected with the rechargeable work battery A in the power supply module, the output of the operational amplifier IC21 is connected with the analog to digital conversion input of the analog to digital converter IC20, so that the voltage of the rechargeable work battery A can be detected, the user is reminder to notice the voltage of the rechargeable work battery A of the on-line measurement instrument for battery internal resistance.

There are 13 keys in the keyboard, they are "clear" key, "measure" key, "save" key, "save record number" key, "record+" key, "record−" key, "group+" key, "time" key, "average value" key, "display" key, "send" key, "print" key, "start" key.

The model of the high efficient digital filter IC12 is MAX291; the model of the operational amplifiers IC10 is AD620; the model of the operational amplifier IC11, IC14 and IC32 is TLC2274; the model of the microprocessor IC51 is PIC16C74; the model of the microprocessor IC30 is PIC16C54; the model of the microprocessor IC13 is PIC12C508; the module of the analog to digital converter IC20 is TLC2543; the model of the precise reference voltage source IC22 is MC1403; the model of the digital to analog converter IC31 is DAC0832; the model of the calendar clock generator IC53 is 12C887; the model of the temperature detector IC52 is 18B20; the model of the digital memory IC50 is 24C64; the capacitance of capacitor C14 is 4.7 µF; the resistance of resistor R16 is 100 KΩ

The work process of the on-line measurement instrument for battery internal resistance is as following:

a. Determine if "start" key is pressed, if no, continue to determine, if yes, go to step b.

b. System initialization, then go to step c.

c. Determine if "measure" key is pressed, if no, continue to determine, if yes, go to step d.

d. Detect the assistant parameters such as voltage, measurement time and environment temperature and the like of the battery under measurement BT and save them, then go to step e.

e. Start the signal generation module and delay 4 seconds, then go to step f.

f. Determine if there is an interrupt signal in the signal generation module, if no, continue to determine, if yes, go to step g.

g. The output signals of the current operational module and the voltage measurement module used for on-line measurement of battery internal resistance are measured through the analog to digital conversion module, and then go to step h.

h. The internal resistance of the battery under measurement is calculated according to Ohm's law, then go to step i.

i. The internal resistance and all assistant parameters of the battery under measurement are sent to the Input/Output module to display, print and communicate, then return to step c.

The on-line measurement instrument for battery internal resistance according to the present invention has high measurement accuracy, especially high repeated measurement accuracy, in the case of floating charge the battery under measurement by the battery charger, the measurement results of internal resistance of the battery under measurement by using the instrument according to the present invention are compared with the measurement results by using similar type measurement instrument for internal resistance, the comparing results are as following:

The model of the battery under measurement: GFMD-3000H valve-regulated sealed battery, place of production: Shenyang, quantity: 24.

Firstly, using 0-3 mΩ grade of a battery measurement instrument from one company, the measurement results are as following:

| No. of battery | First time (mΩ) | Second time (mΩ) | Third time (mΩ) | Maximum difference (mΩ) |
| --- | --- | --- | --- | --- |
| 1 | 0.31 | 0.49 | 0.23 | 0.26 |
| 2 | 0.25 | 0.43 | 0.30 | 0.18 |
| 3 | 0.33 | 0.24 | 0.47 | 0.23 |

Then, using the on-line measurement instrument for battery internal resistance according to the present invention, the measurement results are as following:

| No. of battery | First time (mΩ) | Second time (mΩ) | Third time (mΩ) | Maximum difference (mΩ) |
| --- | --- | --- | --- | --- |
| 1 | 0.19 | 0.19 | 0.19 | 0.00 |
| 2 | 0.22 | 0.22 | 0.22 | 0.00 |
| 3 | 0.22 | 0.20 | 0.22 | 0.02 |
| 4 | 0.22 | 0.22 | 0.22 | 0.00 |
| 5 | 0.23 | 0.21 | 0.22 | 0.02 |
| 6 | 0.21 | 0.20 | 0.21 | 0.01 |
| 7 | 0.20 | 0.19 | 0.20 | 0.01 |
| 8 | 0.20 | 0.19 | 0.20 | 0.01 |
| 9 | 0.22 | 0.21 | 0.22 | 0.01 |
| 10 | 0.23 | 0.21 | 0.22 | 0.02 |
| 11 | 0.21 | 0.21 | 0.20 | 0.01 |
| 12 | 0.22 | 0.20 | 0.21 | 0.02 |
| 13 | 0.23 | 0.22 | 0.22 | 0.01 |
| 14 | 0.22 | 0.22 | 0.22 | 0.00 |
| 15 | 0.20 | 0.19 | 0.20 | 0.01 |
| 16 | 0.21 | 0.19 | 0.19 | 0.02 |
| 17 | 0.20 | 0.19 | 0.19 | 0.01 |
| 18 | 0.21 | 0.19 | 0.19 | 0.02 |
| 19 | 0.20 | 0.20 | 0.19 | 0.01 |
| 20 | 0.20 | 0.20 | 0.19 | 0.01 |
| 21 | 0.21 | 0.21 | 0.20 | 0.01 |
| 22 | 0.22 | 0.21 | 0.20 | 0.02 |
| 23 | 0.20 | 0.19 | 0.19 | 0.01 |
| 24 | 0.21 | 0.20 | 0.20 | 0.01 |

From the above two group data, the maximum difference among three measurements by using the battery measurement instrument from the one company is 0.26 mΩ, obviously the measurement is insignificant. The maximum difference among three measurements by using the on-line measurement instrument for battery internal resistance according to the present invention is only 0.02 mΩ, obviously the on-line measurement instrument for battery internal resistance according to the present invention has high repeated measurement accuracy.

The on-line measurement instrument for battery internal resistance according to the present invention can obtain accurate measurement results. The resistance of a copper stick (using an electric soldering iron core instead) with a diameter of 4.8 mm is measured by the instrument, the measurement results are as following:

| Length of copper stick | The measured value using the on-line measurement instrument for battery internal resistance (mΩ) | Theoretical calculation value (mΩ) |
| --- | --- | --- |
| below 6 mm | 0.00 | Below 0.0057 |
| 8 mm-14 mm | 0.01 | 0.0076-0.0133 |
| 17 mm-23 mm | 0.02 | 0.0162-0.0219 |
| 25 mm-32 mm | 0.03 | 0.0238-0.0304 |

The calculation equation for resistance R of the pure copper stick is as following:

$$R = 0.0172 \cdot L/S$$

L is the length of the pure copper stick, unit is m; S is the area of cross section of the pure copper stick, unit is mm·mm; 0.0172 is the conductivity of the pure copper stick, unit is ohm·mm·mm/m.

From the above measurement results, although a copper stick is used to process measurement (a copper stick is not an absolutely pure copper stick, the conductivity of a copper stick is slightly higher than that of a pure copper stick.), the measurement results using the on-line measurement instrument for battery internal resistance according to the present invention has not a big difference compared with the theoretical value, so that the instrument has very high measurement accuracy.

Embodiment 2

Figure 3:
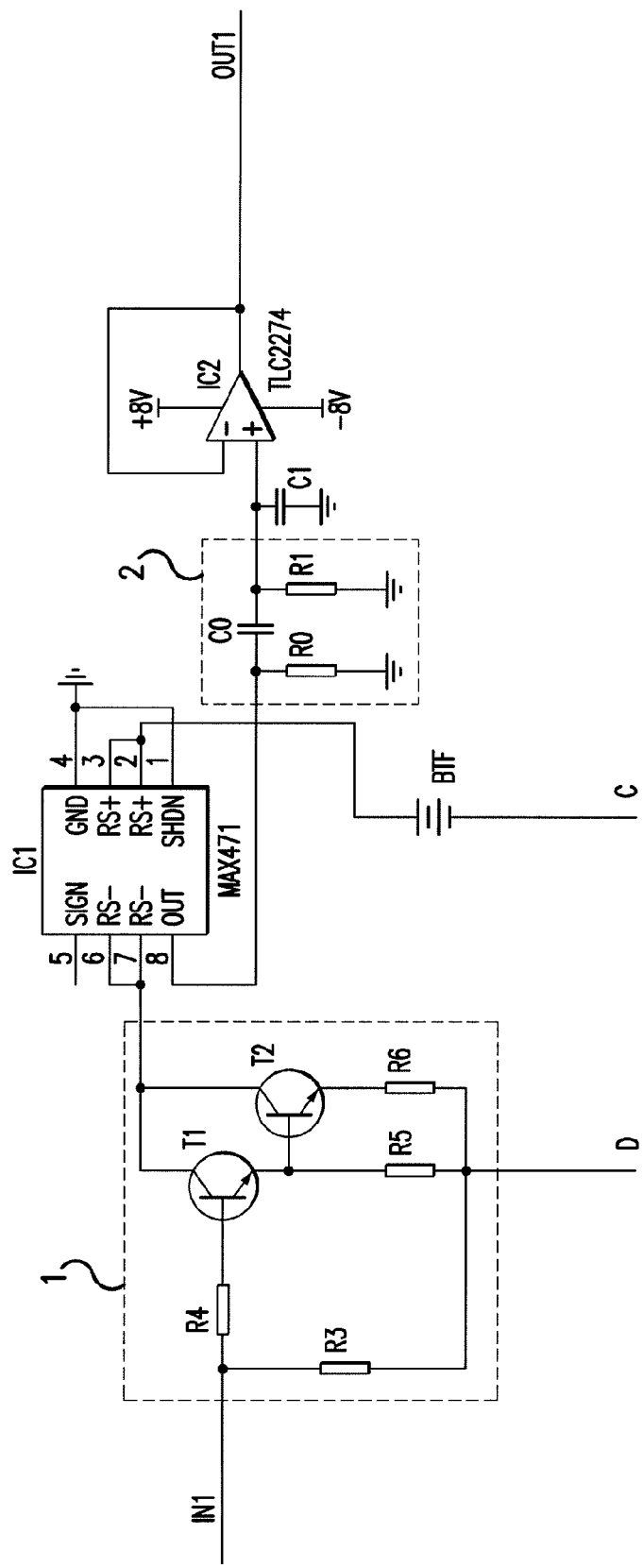
FIG. 3 is another schematic diagram showing the working principle of a current operational module for on-line measurement of battery internal resistance.

With Reference to FIG. 1, FIG. 3, FIG. 6-10, FIG. 12, if the number in figures is the same with that in embodiment 1, it represents the same meaning and has a similar work process, the same parts will not be repeated here, the different parts are: the current operational module for on-line measurement of battery internal resistance further comprises a precise current detection amplifier IC1, it is connected in series with the load circuit 1 and the auxiliary power supply BTF; the collector of the triode T1 and the collector of the triode T2 are connected together and are conceded with the negative end of the internal detection resistance of the precise current detection amplifier IC1, the input of the stopping circuit 2 is connected with the output of the precise current detection amplifier IC1; the model of the precise current detection amplifier IC1 is MAX471.

Embodiment 3

Figure 4:
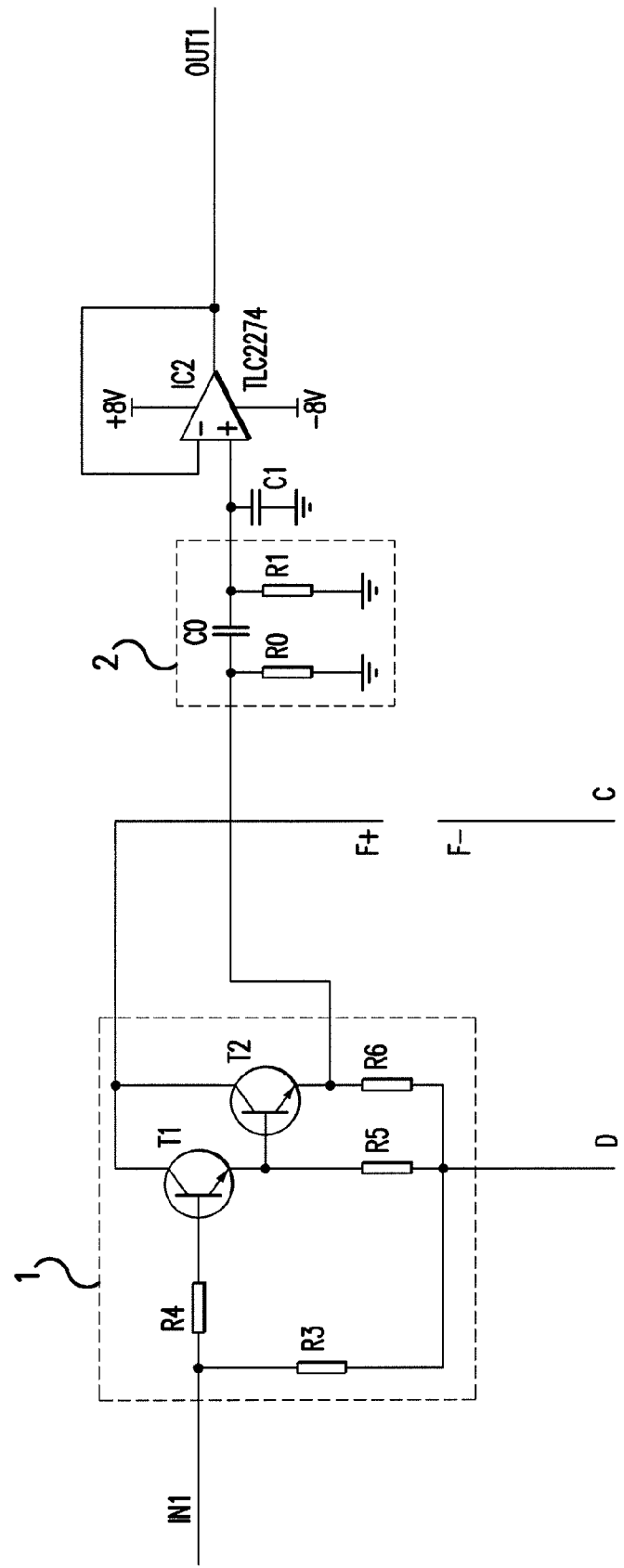
FIG. 4 is another schematic diagram showing the working principle of a current operational module for on-line measurement of battery internal resistance.
Figure 11:
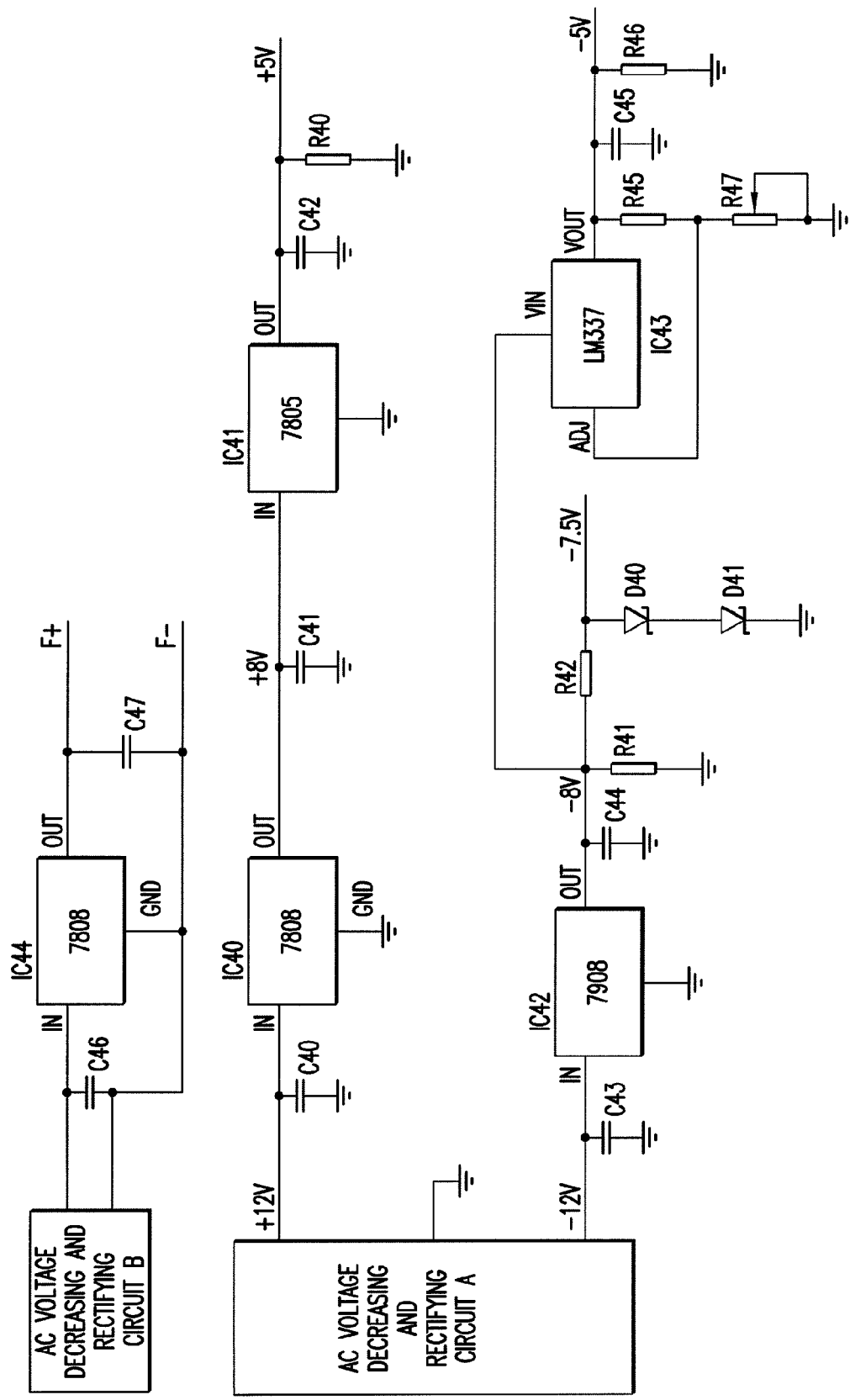
FIG. 11 is another schematic diagram showing a power supply module.

With Reference to FIG. 1, FIG. 4, FIG. 6-9, FIG. 11, FIG. 12, if the number in figures is the same with that in embodiment 1, it represents the same meaning and has a similar work process, the same parts will not be repeated here, the different part is: the auxiliary power supply in the current operational module for on-line measurement of battery internal resistance is a DC voltage-stabilized supply, the positive end of the auxiliary power supply is F+, the negative end of the auxiliary power supply is F−.

Embodiment 4

Figure 5:
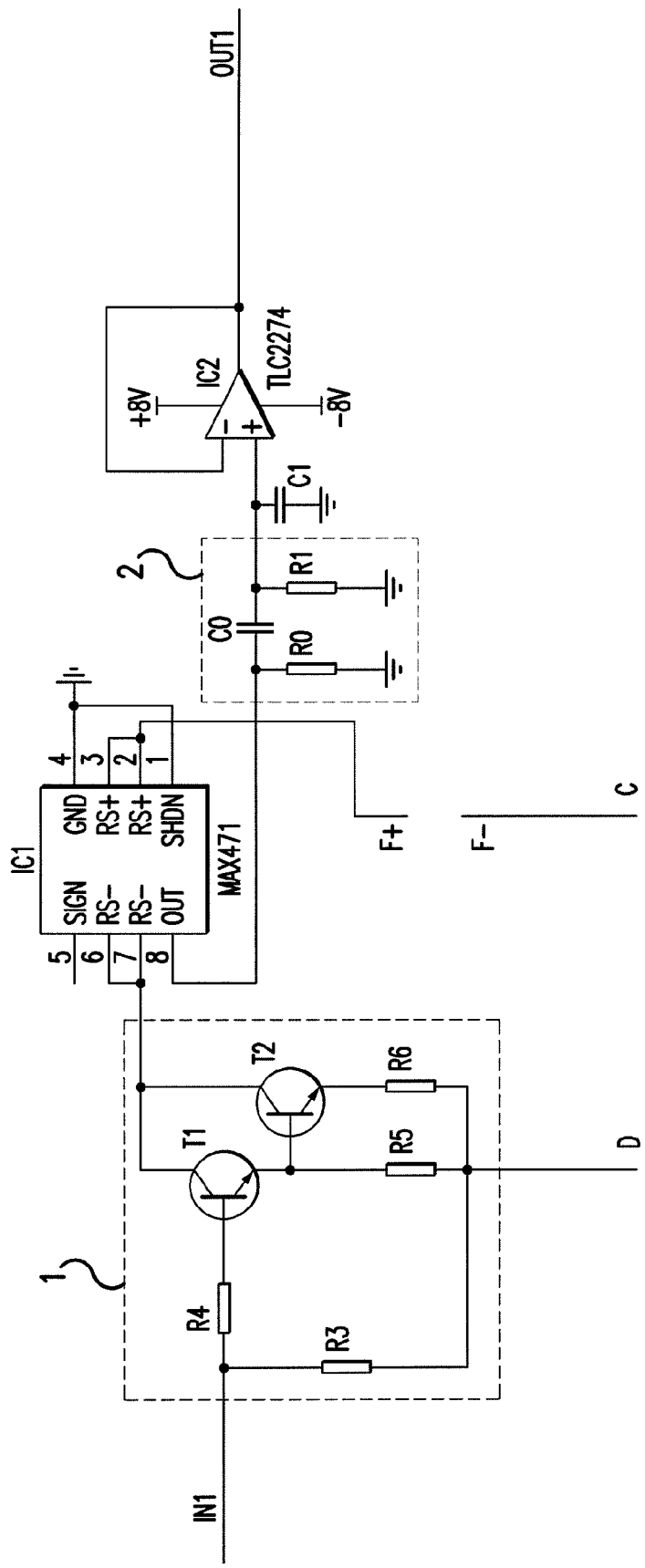
FIG. 5 is another schematic diagram showing the working principle of a current operational module for on-line measurement of battery internal resistance.

With Reference to FIG. 1, FIG. 5, FIG. 6-9, FIG. 11, FIG. 12, if the number in figures is the same with that in embodiment 2, it represents the same meaning and has a similar work process, the same parts will not be repeated here, the different part is: the auxiliary power supply in the current operational module for on-line measurement of battery internal resistance is a DC voltage-stabilized supply, the positive end of the auxiliary power supply is F+, the negative end of the auxiliary power supply is F−.

Embodiment 5

The structure and work process of embodiment 5 is basically same with those of embodiment 1, the same parts will not be repeated here, and the different part is: embodiment 5 adopts a DC voltage-stabilized supply from utility power after decreasing voltage with a transformer, then rectifying and voltage stabilizing to replace the rechargeable work battery A and the rechargeable work battery B in embodiment 1.

Embodiment 6

The structure and work process of embodiment 6 is basically same with those of embodiment 2, the same parts will not be repeated here, and the different part is: embodiment 6 adopts a DC voltage-stabilized supply from utility power after decreasing voltage with a transformer, then rectifying and voltage stabilizing to replace the rechargeable work battery A and the rechargeable work battery B in embodiment 2.

Embodiment 7

The structure and work process of embodiment 7 is basically same with those of embodiment 3, the same parts will not be repeated here, and the different part is: embodiment 7 adopts a DC voltage-stabilized supply from utility power after decreasing voltage with a transformer, then rectifying and voltage stabilizing to replace the rechargeable work battery A and the rechargeable work battery B in embodiment 3.

Embodiment 8

The structure and work process of embodiment 8 is basically same with those of embodiment 4, the same parts will not be repeated here, and the different part is: embodiment 8 adopts a DC voltage-stabilized supply from utility power after decreasing voltage with a transformer, then rectifying and voltage stabilizing to replace the rechargeable work battery A and the rechargeable work battery B in embodiment 4.

The invention claimed is:

1. An on-line measurement method for battery internal resistance, comprising:
   two operational modules connected in parallel with a positive end and a negative end of a battery to be measured, wherein one module of the two operational modules is a current operational module configured to generate an excitation current signal and measure a corresponding excitation current passing through the battery under measurement, and the other module of the two operational modules is a voltage measurement module configured to generate an excitation voltage signal and measure a corresponding excitation voltage between two ends of the battery under measurement,
   wherein the current operational module includes a load circuit configured to discharge a pulse Direct Current (DC) signal to generate the excitation current signal, the pulse DC signal having one DC component and one sine Alternating Current (AC) component,
   wherein work power of the load circuit is supplied by an auxiliary power supply connected in series with the load circuit, one end of the load circuit being connected with a positive end of the auxiliary power supply, and a positive end of the battery under measurement being connected with a negative end of the auxiliary power supply,
   wherein the load circuit is controlled by a signal generation module so that a frequency of the sine AC component is 10 Hz-25 Hz, and
   wherein the voltage measurement module includes
      a stopping capacitor configured to remove DC component in the voltage signal,
      an operational amplifier configured to amplify the voltage signal,
      a high efficient digital filter configured to filter the amplified voltage signal, and
      a resistance-capacitance coupled circuit configured to eliminate an effect of an output offset voltage from the filtered voltage signal and output the excitation voltage signal,
   wherein the excitation current signal output from the current operational module and the excitation voltage signal output from the voltage measurement module are converted to respective digital signals by an analog-to-digital converter which are sent to a central processing module, and
   wherein the central processing module is configured to calculate an internal resistance of the battery under measurement according to measured values of the excitation current signal and the excitation voltage signal.

2. The method according to claim 1, wherein
   an output signal of the high efficient digital filter is output after passing through a resistance-capacitance coupled circuit, and
   an output signal of the load circuit or the current detection amplifier is output after passing through a stopping circuit.

3. The method according to claim 1, wherein
   the excitation current signal and the excitation voltage signal are used to measure resistance of a metal stick or a metal bar, and
   the auxiliary power supply comprises one of another battery and a DC voltage-stabilized supply.

4. The current operational module according to claim 1, wherein
   the load circuit comprises a first triode (T1) and a second triode (T2),
   an input of the load circuit is connected with the base of the first triode (T1) through a resistor (R4),
   an emitter of the first triode (T1) is connected with a base of the second triode (T2),
   a collector of the first triode (T1) and a collector of the second triode (T2) are connected together and are connected with a negative end of an internal detection resistance of a current detection amplifier of the load circuit or are connected with the positive end of the auxiliary power supply,
   the emitter of the first triode (T1) and the emitter of the second triode (T2) are connected with the negative end of the battery under measurement through a resistor (R5) and a resistor (R6) respectively, the stopping circuit comprises a capacitor (C0), a resistor (R0) and a resistor (R1), two ends of the capacitor (C0) are respectively used as the input and an output of the stopping circuit, and the two ends of the capacitor (C0) are connected to ground through the resistor (R0) and the resistor (R1) respectively, and the input of the stopping circuit is connected with the emitter of the second triode (T2), or is connected with an output of the current detection amplifier.

5. The current operational module according to claim 4, further comprising:

an operational amplifier (IC2), wherein an input of the operational amplifier (IC2) is connected with the output of the stopping circuit.

6. The current operational module according to claim 5, wherein the first triode (T1) is a low power triode,
the second triode (T2) is a high power triode,
a capacitance of capacitor (C0) is 5 µF-10 µF,
a resistance of resistor (R1) is 50 KΩ-100 KΩ,
a resistance of resistor (R0) is 2 KΩ+-5%, and
the auxiliary power supply comprises one of another battery and a DC voltage-stabilized supply.

7. A current operational module for on-line measurement of battery internal resistance, comprising:

a load circuit configured to discharge a pulse DC signal to a battery under measurement;
an auxiliary power supply connected in series with the load circuit; and
a stopping circuit,
wherein the pulse DC signal has one DC component and one sine AC component,
wherein a frequency of the sine AC component is 10 Hz-25 Hz
wherein an output of the load circuit is connected with an input of the stopping circuit, and
wherein one end of the load circuit is connected with a positive end of the auxiliary power supply, and a positive end of the battery under measurement is connected with a negative end of the auxiliary power supply.

8. An on-line measurement instrument for battery internal resistance, comprising:

a current operational module, a voltage measurement module, an analog to digital conversion module, a signal generation module, a central processing module, an Input/Output module, and a power supply module, wherein
the current operational module comprises an auxiliary power supply,
the current operational module and the voltage measurement module are connected in parallel to a positive end and a negative end of a battery under measurement,
an output of the current operational module and an output of the voltage measurement module are connected with an analog to digital conversion input of the analog to digital conversion module,
an Input/Output of the central processing module are connected with the analog to digital conversion module, the signal generation module and the Input/Output module,
an output of the signal generation module is connected with an input of a load circuit of the current operational module,
one end of the load circuit is connected with a positive end of the auxiliary power supply, and the positive end of the battery under measurement is connected with a negative end of the auxiliary power supply, an output of the power supply module is connected with a power supply end of the current operational module, the voltage measurement module, the analog to digital conversion module, the signal generation module, the central processing module and the Input/Output module, the signal generation module is configured to generate a pulse DC signal to control a discharge of the load circuit, the pulse DC signal has one DC component and one sine Alternating Current (AC) component, a frequency of the sine AC component is 10 Hz-25 Hz, and the voltage measurement module includes a stopping capacitor configured to remove a DC component in the voltage signal, an operational amplifier configured to amplify the voltage signal, a high efficient digital filter configured to filter the amplified voltage signal, and a resistance-capacitance coupled circuit configured to eliminate an effect of an output offset voltage from the filtered voltage signal and output a voltage measurement signal.

9. The on-line measurement instrument according to claim 8, wherein the stopping capacitor comprises a capacitor (C10) and a capacitor (C11), one end of the capacitor (C11) is connected with the negative end of the battery under measurement, another end of the capacitor (C11) is connected with a positive input of an operational amplifier (IC10), one end of the capacitor (C10) is connected with the positive end of the battery under measurement, another end of the capacitor (C10) is connected with a negative input of the operational amplifier (IC10), an output of the operational amplifier (IC10) is connected with an input of the high efficient digital filter through an operational amplifier (IC11), one output of an microprocessor (IC13) is connected with a clock input of the high efficient digital filter, the output of the high efficient digital filter is connected with an input of the resistance-capacitance coupled circuit, and an output of the resistance-capacitance coupled circuit is connected with an input of an operational amplifier (IC14).

10. The on-line measurement instrument according to claim 9, wherein a resistor (R10) and a resistor (R11) of the load circuit are connected in series and are connected in parallel between the positive input and the negative input of the operational amplifier (IC10), the connection point of the resistor (R10) and the resistor (R11) is either connected with ground or is not connected with ground, the resistance-capacitance coupled circuit comprises a capacitor (C14) and a resistor (R16), one end of the capacitor (C14) is connected to the input of the resistance-capacitance coupled circuit, another end of the capacitor (C14) is connected to the output of the resistance-capacitance coupled circuit and connected with one end of the resistor (R16), and another end of the resistor (R16) is connected with ground.

11. The on-line measurement instrument according to claim 10, wherein the analog to digital conversion module comprises an analog to digital converter and a voltage reference source, an output of the voltage reference source is connected with a voltage reference input of the analog to digital converter, the positive end of the battery under measurement is connected with an analog to digital conversion input of the analog to digital conversion module, the signal generation module comprises a microprocessor (IC30), a digital to analog converter, and an operational amplifier (IC32), a data output of the microprocessor (IC30) is connected with a data input of the digital to analog converter, an output of the digital to analog converter is connected with an input of the operational amplifier (IC32), an output of the operational amplifier (IC32) is connected with an input of the load circuit, the central processing module comprises a microprocessor (IC51), a temperature detector, a calendar clock generator, and a data memory, an Input/Output of the microprocessor (IC51) is connected with an Input/Output of the temperature detector, the calendar clock generator, and the data memory, an interrupt input of the microprocessor (IC51) is connected with an output of the microprocessor (IC30), the Input/Output module comprises a serial port conversion module, a display, a keyboard and a printer, and the power supply module comprises a regulator.

12. The on-line measurement instrument according to claim 11, wherein the serial port conversion module is an RS-232 serial port conversion module, the display is an LED display, a capacitance of the capacitor (C14) is 1-10 μF, and a resistance of the resistor (R16) is 20 KΩ-200 KΩ.

\* \* \* \* \*